(12) United States Patent
Shen et al.

(10) Patent No.: US 6,980,910 B1
(45) Date of Patent: Dec. 27, 2005

(54) EXTENSIONS TO DYNAMICALLY CONFIGURABLE PROCESS FOR DIAGNOSING FAULTS IN ROTATING MACHINES

(75) Inventors: Hwa N. Shen, Brookfield, WI (US); Rick A. Verhaalen, Germantown, WI (US)

(73) Assignee: Johnson Controls Technology Company, Plymouth, MI (US)

(*) Notice: Subject to any disclaimer, the term of this patent is extended or adjusted under 35 U.S.C. 154(b) by 171 days.

(21) Appl. No.: 10/396,089

(22) Filed: Mar. 25, 2003

Related U.S. Application Data

(63) Continuation-in-part of application No. 09/812,924, filed on Mar. 20, 2001, now Pat. No. 6,560,552.

(51) Int. Cl.⁷ .......................... G06F 19/00; G01M 7/00
(52) U.S. Cl. .......................... 702/56; 702/35; 702/183; 702/185; 73/579; 73/660
(58) Field of Search .......................... 702/33, 34, 35, 702/56, 182, 183, 185, 189, 190; 73/462, 73/579, 559, 602, 660

(56) References Cited

U.S. PATENT DOCUMENTS

| | | | |
|---|---|---|---|
| 5,210,704 A * | 5/1993 | Husseiny | 702/34 |
| 5,544,073 A * | 8/1996 | Piety et al. | 700/279 |
| 5,922,963 A * | 7/1999 | Piety et al. | 73/659 |
| 6,041,287 A * | 3/2000 | Dister et al. | 702/182 |
| 6,049,764 A * | 4/2000 | Stahl | 702/183 |
| 6,289,735 B1 * | 9/2001 | Dister et al. | 73/579 |
| 6,560,552 B2 * | 5/2003 | Shen et al. | 702/56 |

* cited by examiner

*Primary Examiner*—Bryan Bui
(74) *Attorney, Agent, or Firm*—Foley & Lardner LLP

(57) ABSTRACT

A method and apparatus for detecting problems in a rotating machine is disclosed. The method and apparatus include creating a definition of the rotating machine using a plurality of templates that specify components and functional characteristics of the components. In addition, the method and apparatus include identifying a plurality of sensors configured to provide operational data related to the rotating machine and defining a plurality of problem rules including logical expressions by which machine faults are deduced from specified portions of the operational data. Further, the method and apparatus include performing an analysis of operation of the rotating machine, the analysis including acquiring actual operational data from the plurality of sensors and applying the problem rules and templates to the operational data to detect faults in the rotating machine and in response thereto generating an indication when a fault is detected.

32 Claims, 6 Drawing Sheets

FIG. 2A
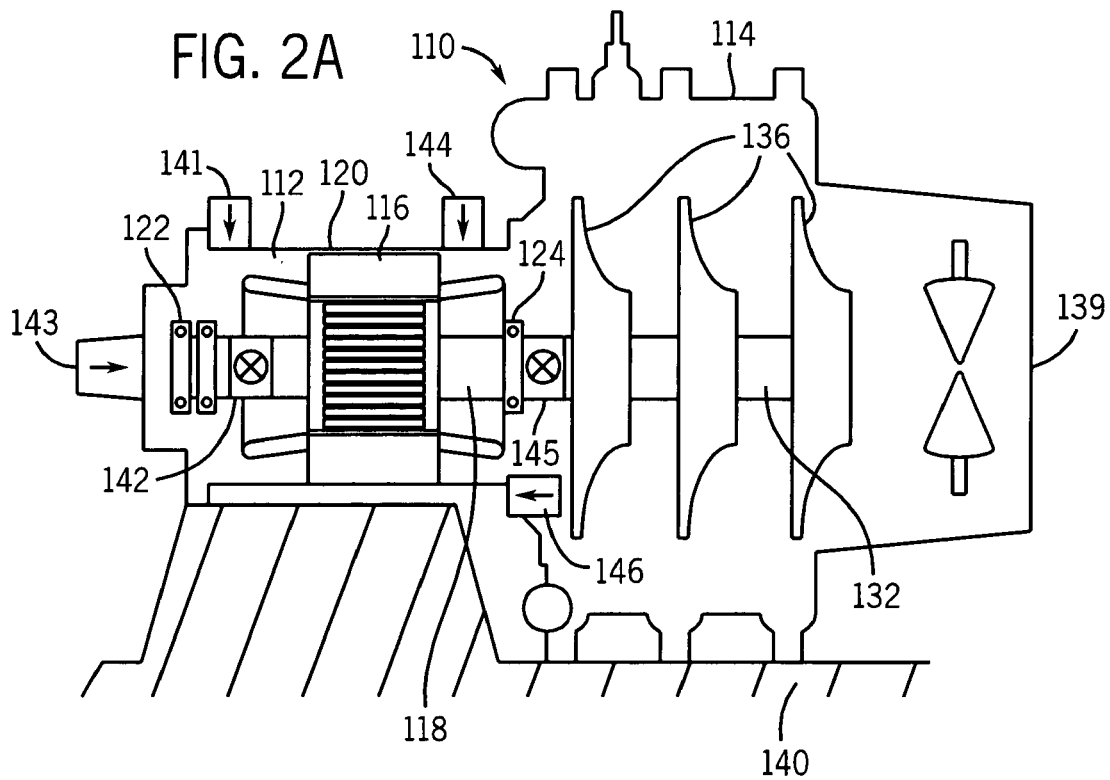
FIG. 2B
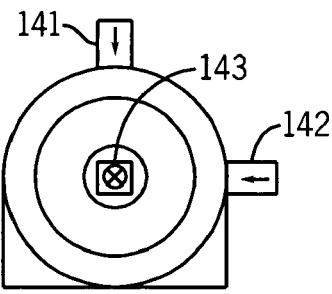
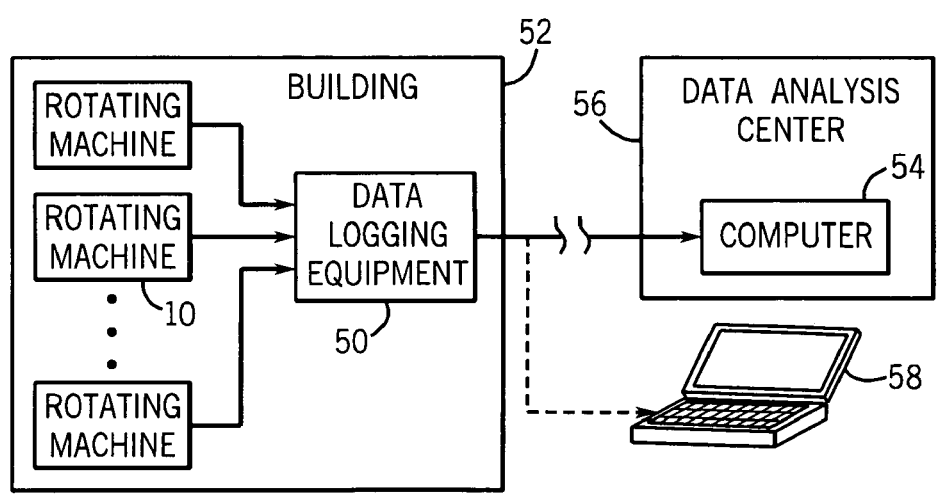
FIG. 3

EXTENSIONS TO DYNAMICALLY CONFIGURABLE PROCESS FOR DIAGNOSING FAULTS IN ROTATING MACHINES

CROSS-REFERENCE TO RELATED PATENT APPLICATIONS

This application is a continuation-in-part of prior filed U.S. patent application Ser. No. 09/812,924, entitled DYNAMICALLY CONFIGURABLE PROCESS FOR DIAGNOSING FAULTS IN ROTATING MACHINES, filed on Mar. 20, 2001 now U.S. Pat. No. 6,560,552, the entire contents of which are incorporated herein by reference.

BACKGROUND OF THE INVENTION

The present invention relates generally to apparatus and methods for monitoring the operation of rotating machines, such as compressors and pumps in heating, ventilation and air conditioning systems. In particular, the invention relates to apparatus and methods that monitor vibration of such rotating machines.

Rotating machines have a wide variety of applications. For example, motors drive compressors and pumps in heating, ventilation and air conditioning (HVAC) systems found in most buildings. Inevitably such machinery develops various mechanical problems with time. Bearings wear, cracks and other deformations develop, and the rotating components become unbalanced. Initially such faults merely reduce the efficiency and performance of the machine. However, if not remedied in time, the faults can progress in magnitude to a point at which the machine fails to operate or causes damage to other components. A relatively inexpensive and simple repair if made early in the fault progression can prevent more serious and expensive subsequent repairs.

Therefore, it is desirable to detect and locate malfunctioning components as early as possible. In addition, it is desirable to detect such faults without interfering with normal machine operation. Taking a machine out of service to perform diagnostic operations may be undesirable and inefficient. Furthermore, the onset of many defects often is not apparent without extensively dismantling the machine. Accordingly, it would be advantageous to provide a system that is capable of continuously monitoring machines and automatically diagnosing faults without interfering with the normal operational procedures.

Fault analysis of rotating machinery is based on interpreting specific data values. For vibration analysis, these values may include peaks of the frequency spectrum, the energy over a specified frequency band, or a direct input value, such as the operating load of the machine at the time when the measurements were made. FIG. 4 illustrates some of these values, including peaks in the frequency spectrum. Vibrations produced by rotating machinery are a result of the physical characteristics of a particular machine. Consequently, the extraction of fundamental frequencies and their amplitudes for various components is important in determining the condition of a machine. The amplitudes of the vibrations produced and the combination of different vibrations can be interpreted to determine the condition of a machine. Furthermore, since numerous machines have the same physical characteristic (i.e., the same manufacturer and model), they often are expected to produce similar vibrations. Therefore, information about a first machine may be useful in analyzing a second machine.

Accordingly, it would be advantageous to provide a system that allows an end-user to create general templates that capture the analytical knowledge of the user as well as incorporate vibration spectra collected from instrumentation of various machines in order to serve as a basis for an overall vibration analysis. In addition, since vibration analysis can often be quite complex, it would also be advantageous to provide an effective method of defining, organizing, and arranging rules and templates used in the overall vibration analysis.

SUMMARY OF THE INVENTION

One embodiment of the present invention provides a method for diagnosing faults in a rotating machine including creating a definition of the rotating machine using a plurality of templates that specify components and functional characteristics of the components. In addition, the method includes identifying a plurality of sensors configured to provide operational data related to the rotating machine and defining a plurality of problem rules including logical expressions by which machine faults are deduced from specified portions of the operational data. Further, the method includes performing an analysis of operation of the rotating machine, the analysis including acquiring actual operational data from the plurality of sensors and applying the problem rules and templates to the operational data to detect faults in the rotating machine and in response thereto generate an indication when a fault is detected.

Another embodiment of the present invention provides a method for diagnosing faults in a rotating machine including creating templates that provide a definition of the rotating machine, the templates representing components and functional characteristics of the components. In addition, the method includes performing an analysis of operation of the rotating machine, the analysis including acquiring actual operational data from a plurality of sensors associated with the rotating machine, and applying the templates to the operational data using problem rules to detect faults in the rotating machine and in response thereto generating an indication when a fault is detected.

Another embodiment of the present invention provides a method defining rules that specify fault conditions and severity in a rotating machine including creating rules based on components and operational characteristics of the components, wherein the rules define formulae by which the rotating machine faults are deduced from operational data. In addition, the method includes utilizing a hierarchical tree-based structure to arrange the rules, the structure allowing an arbitrary grouping of logical expressions.

Another embodiment of the present invention provides a method for diagnosing faults in a rotating machine including defining rules based on components and operational characteristics of the components, where the rules define formulae by which rotating machine faults are deduced from operational data. In addition, the method includes utilizing a hierarchical tree-based structure to arrange the rules, the structure allowing an arbitrary grouping of logical expressions. Further, the method includes performing an analysis of operation of the rotating machine, the analysis including acquiring actual operational data from a plurality of sensors associated with the rotating machine, and applying the rules to the operational data to detect faults in the rotating machine and in response thereto generating an indication when a fault is detected.

Another embodiment of the present invention provides an apparatus for diagnosing faults in a rotating machine including a means for creating a definition of the rotating machine using a plurality of templates that specify components and functional characteristics of the components, a means for identifying a plurality of sensors configured to provide operational data related to the rotating machine, and a means for defining a plurality of problem rules including logical expressions by which machine faults are deduced from specified portions of the operational data. In addition, the apparatus includes a means for performing an analysis of operation of the rotating machine, the analysis including acquiring actual operational data from the plurality of sensors and applying the problem rules and templates to the operational data to detect faults in the rotating machine and in response thereto generate an indication when a fault is detected.

Another embodiment of the present invention provides a system for diagnosing faults in a rotating machine, the system including a programmed microprocessor configured to perform an analysis of operation of the rotating machine, the analysis including acquiring actual operational data from a plurality of sensors associated with the rotating machine, and applying templates that specify components and functional characteristics of the components to the operational data using problem rules to detect faults in the rotating machine and in response thereto generating an indication when a fault is detected.

BRIEF DESCRIPTION OF THE DRAWINGS

FIG. 2A is a schematic representation of a direct drive centrifugal chiller according to an exemplary embodiment of the present invention.

FIG. 2B is an end view of the motor in FIG. 2A.

FIG. 3 is a block schematic diagram of the circuitry for diagnosing problems in the motor and compressor.

DETAILED DESCRIPTION OF THE PREFERRED EMBODIMENTS

Figure 1A:
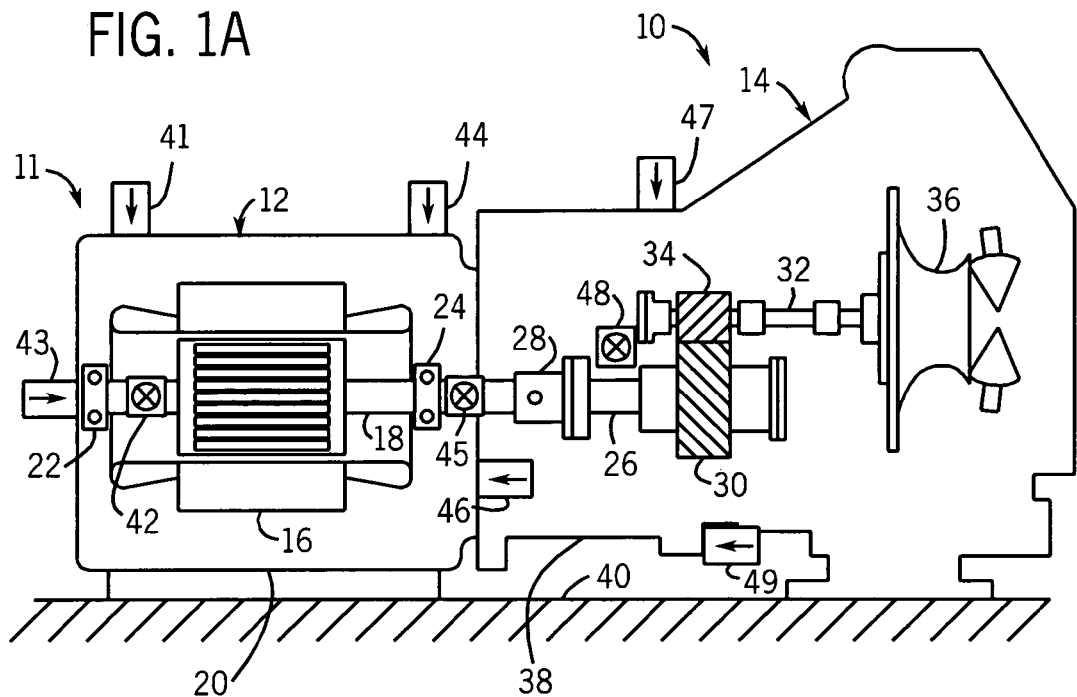
FIG. 1A is a schematic representation of a geared centrifugal chiller according to an exemplary embodiment of the present invention.

Referring to FIG. 1A, an exemplary rotating machine 10 is provided. Machine 10 includes a compressor 14 of the type that is commonly found in a geared centrifugal chiller and is driven by motor 12. Motor 12 comprises stator coils 16 surrounding a motor shaft 18. Shaft 18 is supported within housing 20 of motor 12 by a first bearing 22 at the off-end of the motor 12 and by a second bearing 24 at the drive-end of the motor. Motor shaft 18 is connected to a low speed compressor shaft 26 of compressor 14 by a standard coupling 28.

Low speed compressor shaft 26 has a first gear 30 mounted thereon so as to rotate with shaft 26. A high speed compressor shaft 32 of compressor 14 is connected to a second gear 34 which meshes with first gear 30. The high speed compressor shaft 32 also is coupled to a compressor impeller 36 which produces a flow of refrigerant at a relatively high pressure.

Housing 20 of motor 12 is shown connected directly to housing 38 for compressor 14, but in other embodiments, the housings may be detached from one another. Both the motor and the compressor are in turn attached to a structural element 40 of the building with which they are used. For example, housings 20 and 38 may be bolted to either a concrete pad on the ground or to a platform on the building roof. Other mounting techniques incorporate vibration isolation devices between the respective housing 20 and 38, and the support member for rotating machine 10. As will be described, the resiliency, or lack of resiliency of the mounting mechanism affects the amount of vibration in rotating machine 10.

Figure 1B:
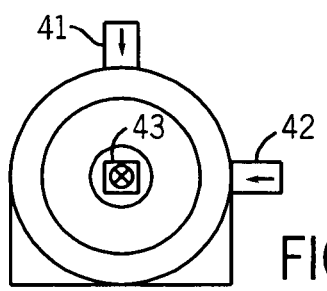
FIG. 1B is an end view of the motor in FIG. 1A.
Figure 4:
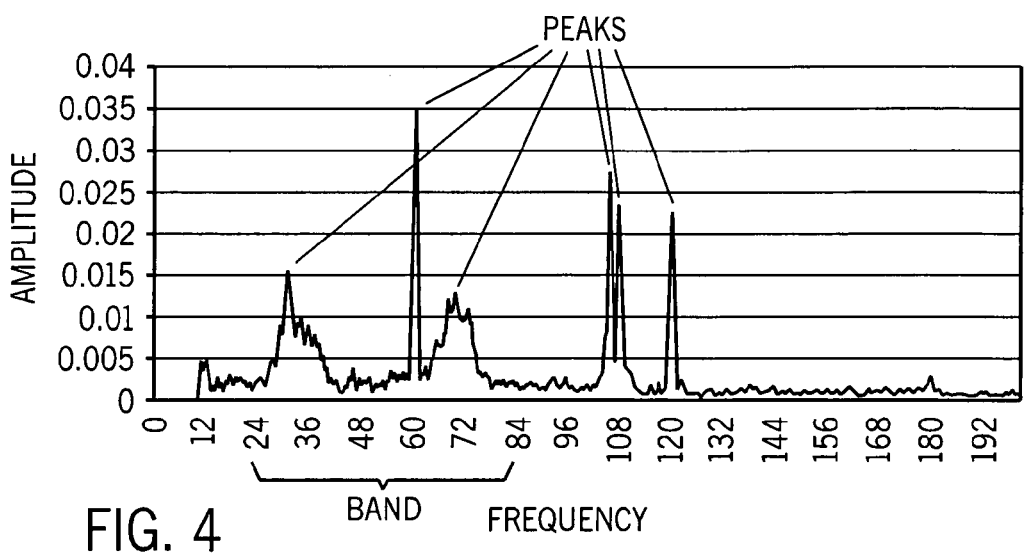
FIG. 4 is a typical spectrum diagram showing peaks in amplitude over frequency.

Nine vibration sensors 41–49, such as accelerometers, are mounted to the structure of motor 12 and compressor 14. Although nine vibration sensors are used in this example, any number of sensors may be used (e.g., 6, 12, 15, etc.). With respect to motor 12, three vibration sensors 41, 42 and 43 are fixedly attached to motor housing 20 at the off-end on three orthogonal axes, as also shown in FIGS. 1A and 1B. Specifically, the first vibration sensor 41 is mounted to the top surface of motor housing 20 so as to sense vibrations in a vertical direction, and the second vibration sensor 42 is attached to the side of motor housing 20 to sense vibrations along a horizontal axis (axial direction). The third vibration sensor 43 is mounted to the end surface of motor housing 20 in an orientation to sense vibrations occurring along the longitudinal axis of motor shaft 18. A similar trio of vibration sensors 44, 45 and 46 are mounted at the drive-end of motor housing 20. The fourth, fifth and sixth sensors 44, 45 and 46 sense vibrations at that end of the motor in the vertical, horizontal and longitudinal axes, respectively. Another set of three vibration sensors 47, 48 and 49 are attached to housing 38 of the compressor 14. Specifically, the seventh vibration sensor 47 is attached to sense vibrations in the vertical direction, the eighth vibration sensor 48 produces a signal indicating vibrations in the horizontal direction, and the ninth vibration sensor 49 detects vibrations occurring in a direction parallel to the longitudinal axis of shafts 28 and 32.

According to alternative embodiments of the present invention, any number of different chillers may be used. For example, instead of a geared centrifugal chiller (as described above), a different type of chiller, such as a direct derive centrifugal chiller may also be used in HVAC applications. As shown in FIG. 2A, an alternative exemplary rotating machine 110 is provided. Machine 110 includes a compressor portion 114 of the type that is commonly found in a direct drive centrifugal chiller and is driven by a motor 112. Motor 112 comprises stator coils 116 surrounding a motor shaft 118. Shaft 118 is supported within a motor housing 120 of motor 112 by a first bearing 122 at the off-end of the motor 112 and by a second bearing 124 at the drive-end of the motor. Motor shaft 118 is directly connected to impellers 136 without any intervening gear sets as described above with respect to the geared centrifugal chiller of FIG. 1A.

Motor housing 120, together with an impeller housing 138, form a housing 139. Both the motor and the compressor are in turn attached to a structural element 140 of the building with which they are used. For example, housing 139 may be bolted to either a concrete pad on the ground or to a platform on the building roof. Other mounting techniques incorporate vibration isolation devices between the respective housing 120 and 138, and the support member for rotating machine 110. As will be described, the resiliency, or lack of resiliency of the mounting mechanism affects the amount of vibration in rotating machine 110.

Six vibration sensors 141–146, such as accelerometers, are mounted to the structure of motor 112 and compressor portion 114. Although six vibration sensors are used in this example, any number of sensors may be used (e.g., 3, 9, 12, 15, etc.). With respect to motor 112, three vibration sensors 141, 142 and 143 are fixedly attached to motor housing 120 at the off-end on three orthogonal axes, as also shown in FIGS. 2A and 2B. Specifically, the first vibration sensor 141 is mounted to the top surface of motor housing 120 so as to sense vibrations in a vertical direction, and the second vibration sensor 142 is attached to the side of motor housing 120 to sense vibrations along a horizontal axis (axial direction). The third vibration sensor 143 is mounted to the end surface of motor housing 120 in an orientation to sense vibrations occurring along the longitudinal axis of motor shaft 118. A similar trio of vibration sensors 144, 145 and 146 are mounted at the drive-end of motor housing 120. The fourth, fifth and sixth sensors 144, 145 and 146 sense vibrations at that end of the motor in the vertical, horizontal and longitudinal axes, respectively.

With reference to FIG. 3, the first through ninth vibration sensors 41–49 on rotating machine 10, or the first through sixth vibration sensors 141–146 on rotating machine 110, are connected to data logging equipment 50 in building 52 in which the rotating machine is located. The data logging equipment 50 digitizes the sensor signals and stores the resultant data samples in an organized manner along with data from other rotating machines in the building. Periodically, such as once a day, the stored data samples are transferred to a diagnostic computer 54 in a data analysis center 56. For example, data analysis center 56 may be a common facility that processes data from buildings throughout a country and provides reports regarding the machine operation to the owners of the individual buildings. Alternatively, the data samples may be transferred into a portable computer 58 that is taken to building 52 by a service technician. The diagnostic computers 54 and 58 execute software that analyzes the sensor data and presents a report indicating the operational health of rotating machine 10 and the other machines in building 52.

The diagnostic computers 54 and 58 can be configured to automatically and systematically diagnose a wide variety of rotating machines with different physical and operational characteristics. This is accomplished by allowing the user to dynamically characterize major components of each machine, construct search equations that extract salient observations from the machine measurements, specify signature rules that deduce machine performance characteristics from the salient observations, and define problem rules that identify faults in the rotating machine. According to a preferred embodiment, reusable and modular templates can be used to define the machine components, search equations and signature rules. In addition, a logical and intuitive hierarchical tree-like structure may be used to define the problem rules which utilize the templates. The flexibility of this apparatus provides the user with the capability to describe classes of rotating machines (e.g. different configurations of machines from different manufacturers) and combine those descriptions with actual measurements in a systematic and logical way to draw conclusions regarding the health of the specific operating machine under investigation.

According to an exemplary embodiment of the present invention, a Predictive Diagnostics Automated Analysis (PDAA), which may be conducted by diagnostic computers 54 and 58, allows an end-user to create templates that capture the analytical knowledge of the user. Although it is intended for engineers with knowledge and expertise in predictive diagnostics such as vibration analysis, many different users may utilize PDAA. In general, PDAA is based on the user building templates that serve as building blocks for the overall vibration analysis. A number of exemplary templates that may be used in the analysis will now be discussed in greater detail.

A Generic Single Value (Gsv) is a template that may define variables of interest in PDAA. For example, Gsvs can be defined for the amplitudes of the fundamental frequencies and the amplitudes of the higher order harmonics of a motor shaft. Gsvs may also be defined outside of vibration spectrum analysis, such as defining metal contamination from oil sample analysis. A Gsv may also define how to extract a single value from the data, including how to extract a peak for the fundamental vibration of a motor shaft. For example, the fundamental vibration amplitude of a motor shaft can be extracted by specifying the high-low frequency limits of the search range, or alternatively, by using a delta frequency together with the expected fundamental frequency.

Another example of a template is a Generic Single Value Equation (GsvEq). GsvEqs may define the search range or the transfer function between Gsvs used in a particular machine model. The primary purpose of a GsvEq can be to specify frequency parameters over which the Gsv can be found and make evaluations to a numerical result. A GsvEq may consist of the following parameter types:

Constant: a numerical value

Numerical Operator: +, −, ×, ÷

[I]: reference to the value of a CompTemp's (see CompTemp description below) input Gsv.

[F]: reference to the value of a CompTemp's (see CompTemp description below) fundamental Gsv.

A Base Component Template (BaseComp) is an example of another template that may model the characteristics of a piece of equipment, unassembled (e.g., a gear set that is sitting on a shelf in a parts room). In general, a BaseComp has certain characteristics that remain constant, regardless of how it is assembled. For example, a gear set's fundamental frequency is its gear mesh frequency (GMF), and its output frequency is the input frequency to the gear set multiplied by the gear ratio in the gear set. It should be noted, however, that a BaseComp does not necessarily have to have a fundamental or output value. For example, a chiller, as a whole, does not have a fundamental value.

A Component Template (CompTemp) can model a piece of equipment based on a power train approach. In other words, a CompTemp can be driven by at most one other CompTemp upstream (power input), and can in turn drive multiple other CompTemps downstream (power output). Attributes of a CompTemp may include:

(a) Name: an arbitrary name used to identify the CompTemp. Duplicate names may exist for different CompTemps.

(b) Fundamental Gsv: the primary value associated with this CompTemp. It is possible that a CompTemp does not have a fundamental Gsv.

(c) Output Gsv: the value that drives any other component that uses it as its drive component. This may reference the input fundamental Gsv, which means that the fundamental value of this component is its output value as well.

(d) Input CompTemp: the component template that drives the component.

A CompTemp may also contain other CompTemps. For example, a motor is a template that contains a motor shaft and ball bearings. Thus, the motor, motor shaft and ball bearings can all be modeled as CompTemps.

Referring to FIGS. 1A and 2A, an example is provided for finding the fundamental vibration of an impeller in both a geared and a direct drive centrifugal chiller using two different approaches for each machine. The first is a method disclosed in co-pending U.S. patent application Ser. No. 09/812,924, entitled DYNAMICALLY CONFIGURABLE PROCESS FOR DIAGNOSING FAULTS IN ROTATING MACHINES, filed on Mar. 20, 2001. In this method, the Gsv's for each component are defined for every different machine type. The second method introduces a procedure that utilizes the BaseComp and the power train concepts.

In the first method, the fundamental Gsv for impeller 36 on a geared centrifugal chiller is a peak Gsv with a low and high frequency search equation that defines the limits of the frequency search band in a spectrum. The low limit equation can be represented by:

$$Eq_1 = \left(2 \times \frac{LF}{POLES} - \frac{3}{2} \times POLES\right) \times G_{ratio} \times Blades \quad (1)$$

and the high limit equation can be represented by $$Eq_2 = \left(2 \times \frac{LF}{POLES}\right) \times G_{ratio} \times Blades \quad (2)$$

where LF is the line frequency of power to the motor, POLES is the number of poles in the motor, $G_{ratio}$ is the gear ratio of the gear set (e.g., $G_2/G_1$), and Blades is the number of blades on the impeller. Typical values for a geared centrifugal chiller are: LF=60 Hz, POLES=2, $G_{ratio}$=2.7442 (118/43), and Blades=17. Substituting these values into equations (1) and (2) provides the following results:

$$LowLimit = \left(2 \times \frac{60}{2} - \frac{3}{2} \times 2\right) \times 2.7442 \times 17 = 2,659 \text{ Hz}$$

$$HighLimit = \left(2 \times \frac{60}{2}\right) \times 2.7442 \times 17 = 2,799 \text{ Hz}$$

Similarly, the search equations for the direct drive centrifugal chiller can be represented by:

$$Eq_1 = \left(2 \times \frac{LF}{POLES} - \frac{3}{2} \times POLES\right) \times Blades \quad (3)$$

$$Eq_2 = \left(2 \times \frac{LF}{POLES}\right) \times Blades \quad (4)$$

Substituting the same specification values into equations (3) and (4) that were used for the geared centrifugal chiller example above provides the following results:

$$LowLimit = \left(2 \times \frac{60}{2} - \frac{3}{2} \times 2\right) \times 17 = 969 \text{ Hz}$$

$$HighLimit = \left(2 \times \frac{60}{2}\right) \times 17 = 1,020 \text{ Hz}$$

Figure 5:
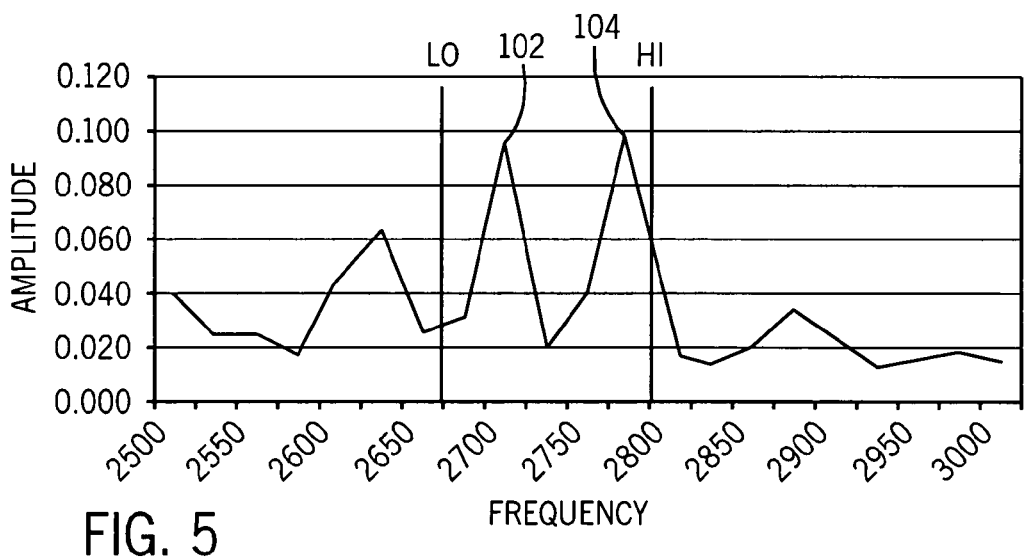
FIG. 5 is a diagram showing a partial view of a spectrum according to an embodiment of the present invention.

FIG. 5 shows a geared centrifugal chiller spectrum that is zoomed in on the 2500–3000 Hz range. In this example, two peaks 102, 104 are within the search range indicated by the hi/lo lines. This is because the hi/lo limits in this method are functions of machine specifications and constant values, which can cause the search range to be relatively large and therefore this method is more likely to capture multiple peaks. Thus, a problem sometimes arises under this method of identifying the "correct" fundamental value due to a relatively larger search range.

The second method introduces two different concepts to evaluate a Gsv. The first concept is the BaseComp template. As described above, a BaseComp is a template that models a component in an unassembled state. It has two primary attributes, a fundamental Gsv, and an output Gsv. The fundamental Gsv is the primary value characteristic of the BaseComp while the output Gsv is the value that is output by the BaseComp. The BaseComp can have as many secondary Gsvs as needed.

In order to create a BaseComp that is re-usable, two new GsvEq parameter types are introduced to refer to values that will be evaluated when the BaseComp is inherited by a CompTemp. They are the Fundamental reference, [F], and Input CompTemp's reference, [I]. The [F] indicates the frequency of the fundamental Gsv is used for evaluation. The [I] indicates the input component's output Gsv's frequency is used for evaluation.

Using the machines in FIGS. 1A and 2A, a BaseComp may be created for a motor shaft, coupling, gear set, shaft, and impeller as follows:

| BaseComp name | Fundamental Gsv | Output Gsv |
|---|---|---|
| Motor shaft | $2 \times \frac{LF}{POLES} - \frac{3}{2} \times POLES, 2 \times \frac{LF}{POLES}$ | [F] |
| Coupling | [I] | [F] |
| Shaft | [I] | [F] |
| Gear set | [f] × $G_{teeth}$ | [I] × $G_{ratio}$ |
| Impeller | [I] × Blades | [F] |

Some of the Fundamental and Output Gsv's have only one GsvEq, while others have two. For example, the motor shaft Fundamental Gsv has two equations, governing the low and high frequency search range. Other Fundamental Gsv's contain only a single GsvEq. For example, the gear set Fundamental Gsv contains a single equation that defines how the gear set's fundamental frequency and its output fundamental frequency are related to the input Gsv value. These Gsv's lead to the concept of a single frequency search method. A single frequency search method calculates a delta value (Δ) that is used to determine low and high search limits around the expected center frequency given by the output Gsv. From the Δ and expected center frequency ($C_f$), the low and high frequency search range can be computed as Low=$C_f$-Δ, and High=$C_{f+\Delta}$.

Two different equations can be used to calculate Δ. The first, $\Delta = Pct \times C_f$, uses a percentage (Pct) of the expected center frequency. A common value for this is 0.01, or 1% of the expected center frequency.

The second equation is $$\Delta = Mf \times Res \times \left(\frac{Cf}{F_{range}}\right),$$

where $M_f$ is a multiplication factor (e.g., 1, 2, 5 are common values), Res is the resolution of the best spectrum that the center frequency is found in, $C_f$ is the center frequency, and $F_{range}$ is the frequency range of the best spectrum that the $C_f$ is found in. The benefit of the second equation is that it automatically and dynamically adjusts the Δ value based on the best resolution spectrum used.

Using the BaseComps, the component templates for the geared and direct drive centrifugal chillers in FIGS. 1A and 2A, respectively, may be created as follows:

and single frequency Gsv's for calculating the Impeller Fundamental Gsv for the geared centrifugal chiller. According to this method, the following equation may be used for calculating the Impeller Fundamental Gsv for the geared centrifugal chiller: ImpellerFund Gsv=[I]×Blades, where [I] refers to the Impeller's input component's output Gsv. In the case of geared centrifugal chiller, [I] is the high-speed compressor shaft's output, which is its Fundamental Gsv, [F]. The high-speed compressor shaft's fundamental Gsv= [I], which again is a reference to the high-speed compressor shaft's input component's output Gsv. Following the power train again, [I] translates to the output of the gear set. The gear set's output contains a reference to its input component, or the low-speed compressor shaft's output. Following the power train further leads to the motor shaft's fundamental Gsv. At this point, the motor shaft fundamental can be found using the same hi/lo search method described previously to find the peak. Using the hi/lo search range, the frequency where the motor shaft fundamental occurred may be located. For the sake of the example, it is assumed that this peak was

Geared Centrifugal Chiller

| CompTemp name | BaseComp | Input CompTemp | Fundamental Gsv | Output Single Value (SV) |
|---|---|---|---|---|
| Motor shaft | Motor shaft | {none} | $2 \times \frac{LF}{POLES} - \frac{3}{2} \times POLES, 2 \times \frac{LF}{POLES}$ | [F] |
| Motor-Compressor coupling | Coupling | Motor shaft | [I] | [F] |
| Low-speed compress shaft | Shaft | Coupling | [I] | [F] |
| Compressor gear set | Gear set | Low-speed compressor shaft | [I] × $G_{teeth}$ | [I] × $G_{ratio}$ |
| High-speed compressor shaft | Shaft | Compressor gear set | [I] | [F] |
| Compressor impeller | Impeller | High-speed compressor shaft | [I] × Blades | [F] |

Direct Drive Centrifugal Chiller

| CompTemp name | BaseComp | Input CompTemp | Fundamental Gsv | Output SV |
|---|---|---|---|---|
| Motor shaft | Motor shaft | {none} | $2 \times \frac{LF}{POLES} - \frac{3}{2} \times POLES, 2 \times \frac{LF}{POLES}$ | [F] |
| Impeller | Impeller | Motor shaft | [I] × Blades | [F] |

Referring to FIG. 1A and the Geared Centrifugal Chiller table above, an example will now be provided that illustrates the second method of utilizing the BaseComp inheritance found at 59.62 Hz. This frequency is then used in evaluating the gear set's output Gsv as follows:

Output $Gsv = 59.62 \times G_{ratio} = 59.62 \times 2.7442 = 163.61$ Hz.

This is the $C_f$ to use to find the gear set's output Gsv. Using the $2^{nd}$ method described to calculate $\Delta$, assumptions may be made that three spectrums exist with the following properties:

| Spectrum | Start Freq. | Stop Freq. | Resolution | $F_{range}$ |
|---|---|---|---|---|
| S1 | 0 | 200 | 0.5 | 200 |
| S2 | 0 | 2000 | 5 | 2000 |
| S3 | 0 | 10,000 | 25 | 25 |

First, the best spectrum is selected. The best spectrum is chosen by finding the spectrum that contains the desired $C_f$ and has the best resolution. For $C_f=163.61$ this would be S1. Again:

$$\Delta = Mf \times Res \times \left(\frac{Cf}{F_{range}}\right).$$

Using $M_f=1.5$ and substituting into the equation:

$$\Delta = 1.5 \times 0.5 \times \left(\frac{163.61}{200}\right) = 0.614 \text{ Hz}$$

gives a low and high search range of 162.99 and 164.22 Hz, respectively. Assuming the peak was found at 163.4 Hz, the frequency of the found peak may be used to calculate the expected $C_f$ for the impeller fundamental (i.e., 163.4×17=2, 777.80 Hz).

The same procedure is followed to determine the $\Delta$ for the gear mesh output:

$$\Delta = Mf \times Res \times \left(\frac{Cf}{F_{range}}\right)$$

With a search frequency of 2,777.80 Hz, the best spectrum would be S3. Applying this to the equation yields $$\Delta = 1.5 \times 25 \times \left(\frac{2,777.80}{10,000}\right) = 10.4168 \text{ Hz}.$$

Figure 6:
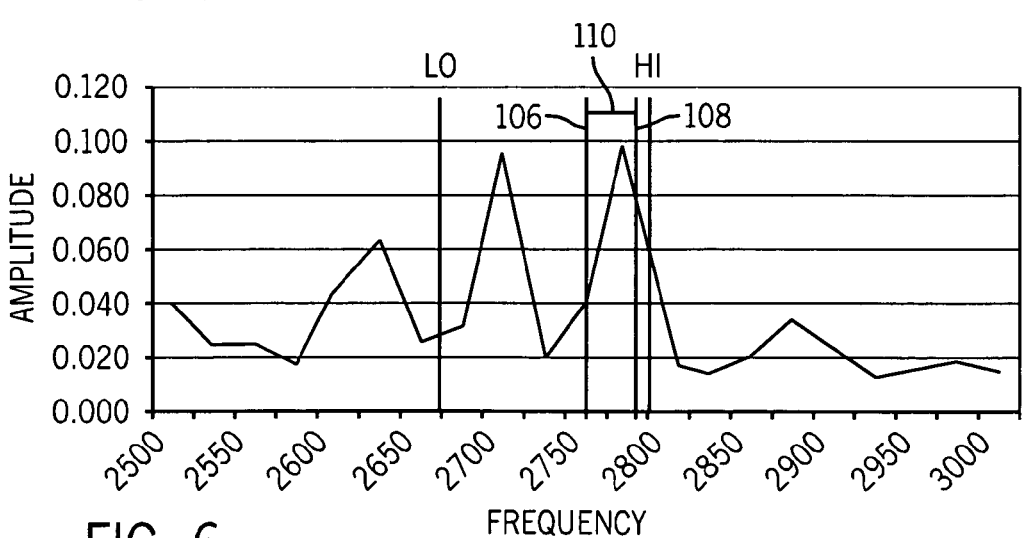
FIG. 6 is a diagram showing a partial view of a spectrum with an adjusted search range according to an embodiment of the present invention.

As shown in FIG. 6, this results in an adjusted search range 110 with low and hi search values of 2,767.38 and 2,788.22, respectively. A similar analysis procedure can be carried out for the direct drive centrifugal impeller, although the analysis is much simpler as the impeller is directly coupled to the motor shaft.

The second method provides a search range that is more accurate (i.e., narrower) than that provided by the first method, thereby resulting in more instances of correct identifications of peaks. FIG. 6 demonstrates how this is true in relation to the search range from the first method. Specifically, the second method uses the actual fundamental frequency found in estimating the expected fundamental frequency of the next component in the "power train." Thus, the second method self-adjusts the frequency search range at each stage based on the best information available. Other methods merely define the hi/lo frequency search range of each component based on the specifications of the machine, such as the line frequency (LF) and number of poles in the motor (POLES). In the example cited, the further a component is away from the driving source (e.g., the motor), the wider the hi/lo search range becomes. This can oftentimes lead to more inaccurate measures of peaks.

There are three distinct advantages of using the template-based generalized power train approach for finding faults in rotating machines over other known methods. First, once a BaseComp template has been built, it can be re-used in other component templates. For instance, the geared centrifugal chiller's impeller and the direct drive centrifugal chiller's impeller may be built using the same impeller BaseComp. Second, using the "power train" idea, the expected center frequency may be accurately captured, and consequently, the search range for a component based on the actual center frequency from the previous component in the "power train" may also be accurately defined. Third, the Gsv for any component in a machine may be retrieved in any order. In the example cited, the impeller fundamental was found by backtracking to the motor shaft, and from the motor shaft the actual motor shaft fundamental was obtained, and the "power train" was then followed in a forward direction to find the impeller fundamental.

Now that the template-based power train approach for defining a machine and parameters of interest and traversing the machine to find vibrations of interest have been defined, exemplary methods of defining rules that specify fault conditions and severity will now be discussed. In formulating problem rules that may occur in various components of a rotating machine, a tree-based problem definition can be used. The advantages of using a tree-based problem formulation are two-fold. First, it allows the user to organize the rule in a hierarchical and logical fashion. Second, the tree structure provides a means whereby the underlying logic that defines a problem can be processed automatically by a computer or other automated system.

Rules can be quite complex, involving extracted and processed values (e.g., fundamental and higher harmonics frequencies and their amplitudes, noise floor, etc.), logical operators (e.g., greater than, less than, not, etc.), measurement locations (e.g., motor drive end vertical, low speed compressor shaft off end radial, etc.), aggregate functions (e.g., max, min), threshold limits, qualifiers (e.g., any, all, etc.), logical connectors (e.g., and, or) and the like. An example of a simple logical expression (L1) is: "maximum of the motor shaft fundamental peak value at all measurement locations on the motor is greater than threshold$_1$." Another, much simpler logical expression (L2) is: "noise floor is less than thresholds$_2$." Using L1 and L2, a problem rule can be formulated: if (L1 is true and L2 is true) then motor shaft vibration is high. In general, the problem rules can involve more complex logical expressions and connectors grouped in various ways. According to a preferred embodiment of the present invention, arbitrary groupings of logical expressions can be achieved by utilizing a hierarchical tree-like structure. Each node of the tree defines a logical expression or a group of logical expressions. If a node specifies a group of logical expressions, then the individual logical expression contained in the group is specified in the subtree beneath the grouping node.

There are two advantages to this tree-like problem specification. First, by using this hierarchical approach, a domain expert can specify any arbitrary logical constructs in the problem rule definition. Second, each logical expression can be checked for its validity, both at the individual logical expression level and the logical grouping level. This second point is important during system development and validation because the problem rules can be methodically checked.

Figure 7:
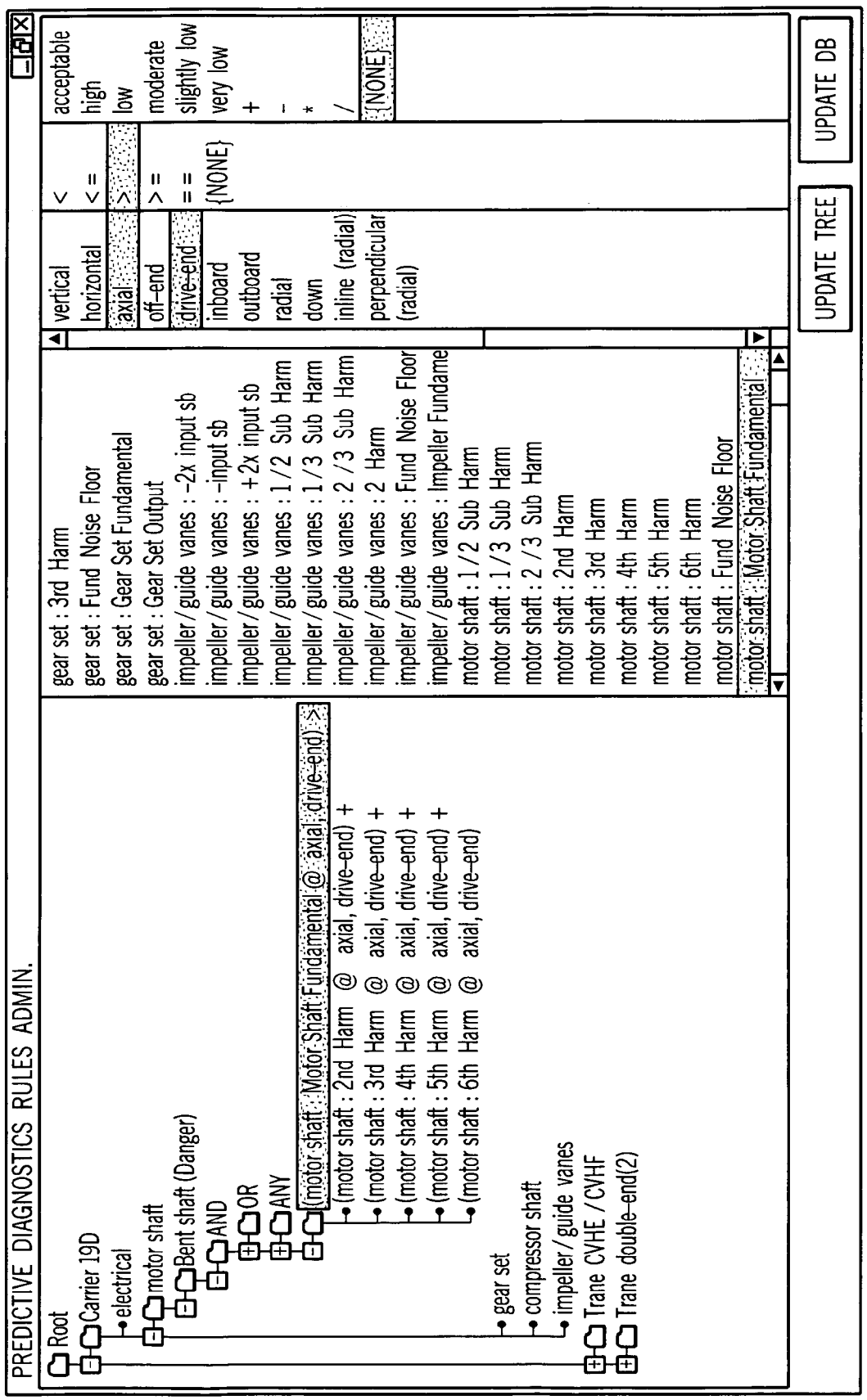
FIGS. 7–9 are diagrams showing examples of tree-based problem definitions for analysis of rotating machines according to exemplary embodiments of the present invention.
Figure 8:
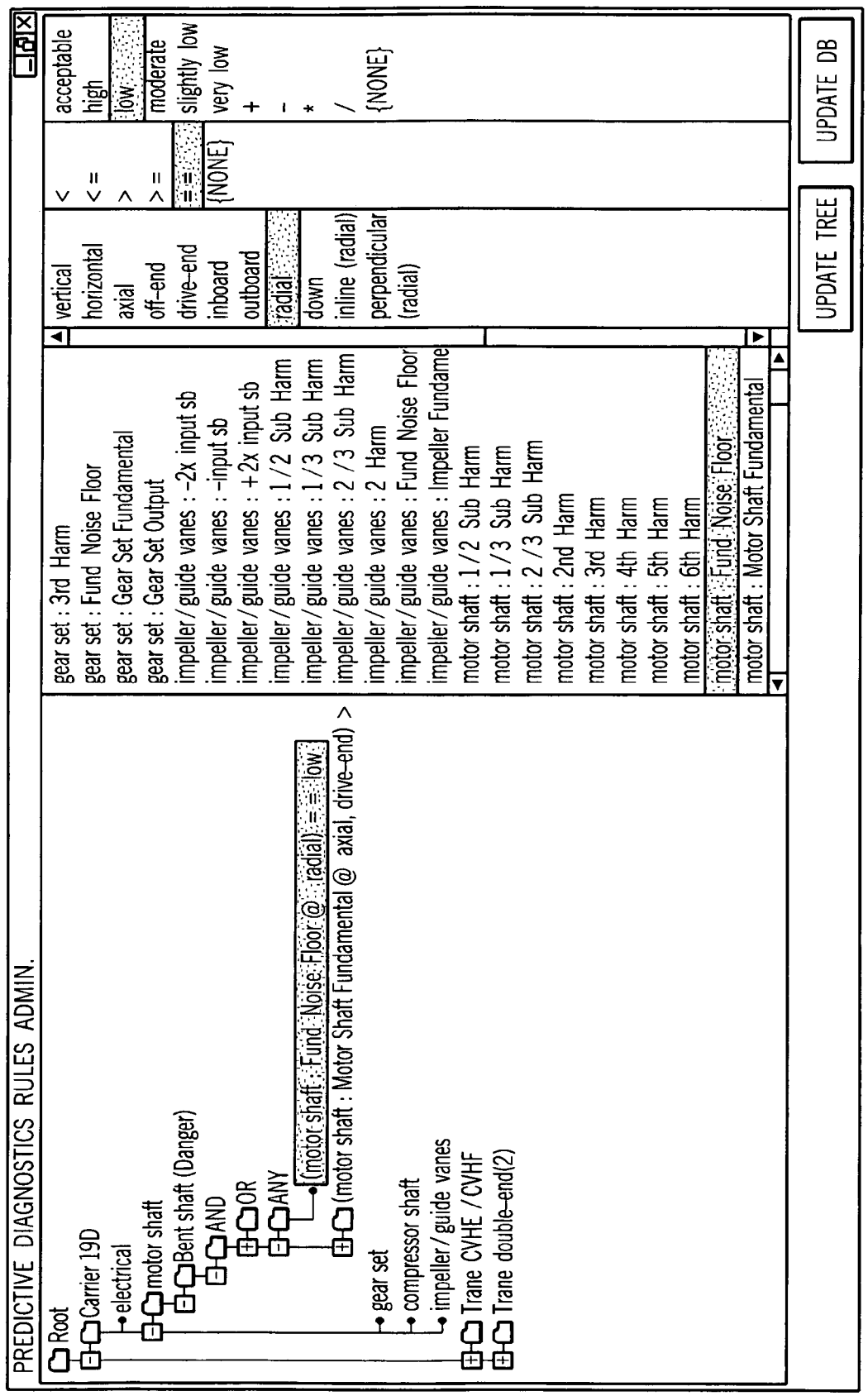
Figure 9:
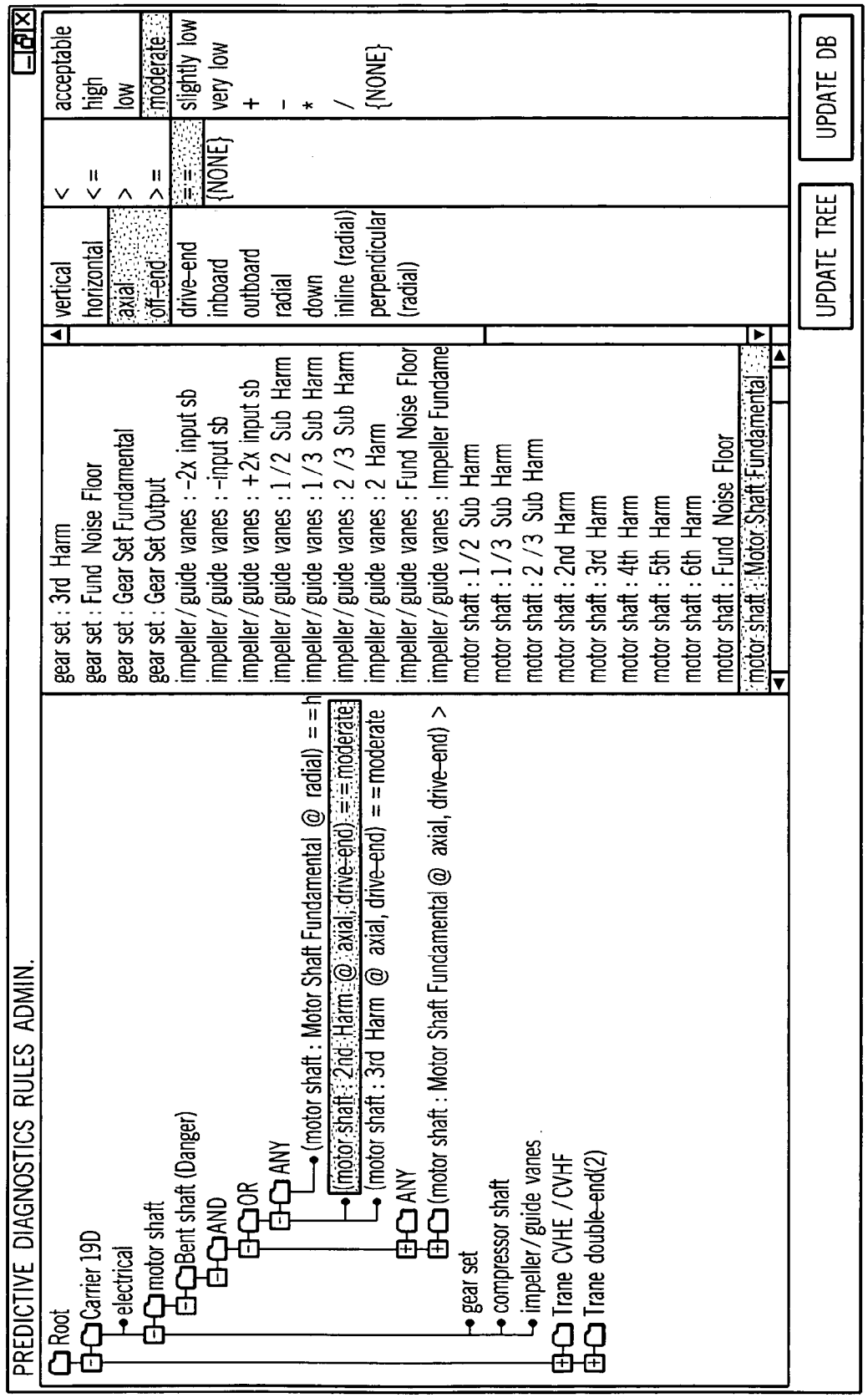

Referring to FIGS. 7, 8 and 9, an exemplary problem named "Bent Shaft (Danger)" may be defined. The problem is composed of three logical expressions, each of which evaluate to true or false and are ANDed together. FIG. 7 specifies one of the logical expressions as the amplitude of the motor shaft fundamental at the motor axial drive-end. In addition, the amplitude of the motor shaft fundamental is greater than the sum of the amplitudes of the $2^{nd}$ through $6^{th}$ harmonics at the motor axial drive-end position.

The middle logical expression is shown in FIG. 8. This expression states that if ANY of the amplitudes of motor shaft noise floor in the radial position is LOW, then the logical expression evaluates to the true state. The motor shaft radial measurement actually involves four measurements (motor shaft drive-end horizontal, motor shaft drive-end vertical, motor shaft off-end horizontal, and motor shaft off-end vertical).

The first logical expression is composed of two sub-logical expressions connected by an OR logical operator. The first sub-logical expression is an ANY type of logical expression as in the middle logical expression shown in FIG. 8, and the second and third sub-logical expressions define amplitudes at a specific measurement position. The specific measurement position is entered through multiple selections in the third panel. Finally, these three logical expressions are ANDed together to define the "Bent Shaft (Danger)" problem.

It is important to note that the above-described preferred embodiments are illustrative only. Although the invention has been described in conjunction with specific embodiments thereof, those skilled in the art will appreciate that numerous modifications are possible without materially departing from the novel teachings and advantages of the subject matter described herein. For example, although the invention is illustrated using particular methods for creating general templates, different algorithms could be used. Accordingly, these and all other such modifications are intended to be included within the scope of the present invention as defined in the appended claims. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the preferred and other exemplary embodiments without departing from the spirit of the present invention.

What is claimed is:

1. A method for diagnosing faults in a rotating machine, said method comprising:
    creating a definition of the rotating machine using a plurality of templates that specify components and functional characteristics of the components;
    identifying a plurality of sensors configured to provide actual operational data related to the rotating machine;
    defining a plurality of problem rules including logical expressions by which machine faults are deduced from specified portions of the actual operational data; and
    performing an analysis of operation of the rotating machine, the analysis including acquiring the actual operational data from the plurality of sensors and applying the problem rules and templates to the actual operational data to detect faults in the rotating machine and in response thereto generating an indication when a fault is detected.

2. The method of claim 1, wherein the creating step comprises:
    selecting at least one base template from a library of pre-existing base templates; and
    modifying the at least one base template with data defining operational characteristics of the components.

3. The method of claim 1, wherein acquiring the actual operational data from the plurality of sensors includes acquiring data indicating vibration of the rotating machine.

4. The method of claim 1, wherein acquiring the actual operational data from the plurality of sensors includes obtaining vibration spectra.

5. The method of claim 4, wherein applying the problem rules and templates to the actual operational data includes searching an expected frequency range in the vibration spectra.

6. The method of claim 5, wherein applying the problem rules and templates to the actual operational data further includes extracting a peak amplitude and corresponding fundamental frequency from within the expected frequency range.

7. The method of claim 1, wherein the creating step includes using a generic single value template for defining variables of interest in the analysis.

8. The method of claim 1, wherein the creating step includes using a generic single value equation template to define frequency parameters over which variables of interest may be identified.

9. The method of claim 1, wherein the creating step includes using a base template for modeling characteristics of a component in an unassembled state.

10. The method of claim 1, wherein the creating step includes using a component template for modeling characteristics of a component in a power train.

11. The method of claim 1, wherein the creating step includes using at least one of the following templates:
    a generic single value for defining a variable of interest in the analysis;
    a generic single value equation to define frequency parameters over which variables of interest may be identified;
    a base template for modeling characteristics of a component in an unassembled state; and
    a component template for modeling characteristics of a component in a power train.

12. A method for diagnosing faults in a rotating machine, said method comprising:
    creating templates that provide a definition of the rotating machine, the templates representing components and functional characteristics of the components; and
    performing an analysis of operation of the rotating machine, the analysis including acquiring actual operational data from a plurality of sensors associated with the rotating machine, and applying the templates to the actual operational data using problem rules to detect faults in the rotating machine and in response thereto generating an indication when a fault is detected.

13. The method of claim 12, wherein applying the templates to the actual operational data includes using problem rules incorporating at least one of the following templates:
    a generic single value for defining a variable of interest in the analysis;

a generic single value equation to define frequency parameters over which variables of interest may be identified;

a base template for modeling characteristics of a component in an unassembled state; and a component template for modeling characteristics of a component in a power train.

14. The method of claim 12, wherein applying the templates to the actual operational data includes using problem rules incorporating the following templates:

a generic single value for defining a variable of interest in the analysis;

a generic single value equation to define frequency parameters over which variables of interest may be identified;

a base template for modeling characteristics of a component in an unassembled state; and a component template for modeling characteristics of a component in a power train.

15. The method of claim 12, wherein creating the templates comprises using the definition of the rotating machine and formulae by which machine faults are deduced from specified portions of the actual operational data.

16. The method of claim 12, wherein acquiring actual operational data from the plurality of sensors includes obtaining vibration spectra.

17. A method of defining rules that specify fault conditions and severity in a rotating machine, the method comprising:

creating rules based on components and operational characteristics of the components, wherein the rules define formulae by which the rotating machine faults are deduced from operational data; and utilizing a hierarchical tree-based structure to arrange the rules, the structure allowing an arbitrary grouping of logical expressions.

18. The method of claim 17, wherein the rules include at least one of the following templates:

a generic single value for defining a variable of interest in the analysis;

a generic single value equation to define frequency parameters over which variables of interest may be identified;

a base template for modeling characteristics of a component in an unassembled state; and a component template for modeling characteristics of a component in a power train.

19. The method of claim 18, where the hierarchical tree-based structure includes nodes that define logical expressions or groups of logical expressions.

20. The method of claim 19, where a node specifies a group of logical expressions and an individual logical expression contained in the group is further contained in a subtree.

21. A method for diagnosing faults in a rotating machine, said method comprising:

defining rules based on components and operational characteristics of the components, where the rules define formulae by which rotating machine faults are deduced from actual operational data;

utilizing a hierarchical tree-based structure to arrange the rules, the structure allowing an arbitrary grouping of logical expressions; and performing an analysis of operation of the rotating machine, the analysis including acquiring actual operational data from a plurality of sensors associated with the rotating machine, and applying the rules to the actual operational data to detect faults in the rotating machine and in response thereto generating an indication when a fault is detected.

22. The method of claim 21, wherein defining rules comprises creating templates including at least one of the following templates:

a generic single value for defining a variable of interest in the analysis;

a generic single value equation to define frequency parameters over which variables of interest may be identified;

a base template for modeling characteristics of a component in an unassembled state; and a component template for modeling characteristics of a component in a power train.

23. A method for analyzing operational data in a rotating machine, said method comprising:

creating a first plurality of templates for defining the rotating machine;

creating a second plurality of templates for defining parameters of interest and search criteria; and performing an analysis of operation of the rotating machine, the analysis including acquiring actual operational data from a plurality of sensors associated with the rotating machine, and applying the first and second plurality of templates to the actual operational data in the rotating machine.

24. The method of claim 23, wherein a power train approach is used to traverse components of the machine and find the parameters of interest.

25. An apparatus for diagnosing faults in a rotating machine, said apparatus comprising:

means for creating a definition of the rotating machine using a plurality of templates that specify components and functional characteristics of the components;

means for identifying a plurality of sensors configured to provide actual operational data related to the rotating machine;

means for defining a plurality of problem rules including logical expressions by which machine faults are deduced from specified portions of the actual operational data; and means for performing an analysis of operation of the rotating machine, the analysis including acquiring the actual operational data from the plurality of sensors and applying the problem rules and templates to the actual operational data to detect faults in the rotating machine and in response thereto generating an indication when a fault is detected.

26. The apparatus of claim 25, wherein the means for performing an analysis comprises a microprocessor programmed to apply the problem rules and templates to the actual operational data.

27. The apparatus of claim 26, wherein the microprocessor is programmed to acquire data indicating vibration spectra of the rotating machine and apply the problem rules and templates to the actual operational data to search an expected frequency range in the vibration spectra in order to extract a peak amplitude and corresponding fundamental frequency from within the expected frequency range.

28. The apparatus of claim 25, wherein the means for creating a definition of the rotating machine uses at least one of the following templates:

a generic single value for defining a variable of interest in the analysis;

a generic single value equation to define frequency parameters over which variables of interest may be identified;

a base template for modeling characteristics of a component in an unassembled state; and a component template for modeling characteristics of a component in a power train.

29. A system for diagnosing faults in a rotating machine, the system including:

a microprocessor programmed to perform an analysis of operation of the rotating machine, the analysis including acquiring actual operational data from a plurality of sensors associated with the rotating machine, and applying templates that specify components and functional characteristics of the components to the actual operational data using problem rules to detect faults in the rotating machine and in response thereto generating an indication when a fault is detected.

30. The system of claim 29, wherein the microprocessor is programmed to acquire vibration spectra from the plurality of sensors and apply the problem rules and templates to the actual operational data in order to search an expected frequency range in the vibration spectra and extract a peak amplitude and corresponding fundamental frequency from within the expected frequency range.

31. The system of claim 30, wherein the programmed microprocessor uses a hierarchical tree-based structure to arrange the rules, the tree-based structure allowing an arbitrary grouping of logical expressions.

32. The system of claim 29, wherein the system uses at least one of the following templates:

a generic single value for defining a variable of interest in the analysis;

a generic single value equation to define frequency parameters over which variables of interest may be identified;

a base template for modeling characteristics of a component in an unassembled state; and a component template for modeling characteristics of a component in a power train.

* * * * *